US006583687B2

(12) United States Patent
Nosaka

(10) Patent No.: US 6,583,687 B2
(45) Date of Patent: Jun. 24, 2003

(54) LAMINATION TYPE LC FILTER

(75) Inventor: Koji Nosaka, Moriyama (JP)

(73) Assignee: Murata Manufacturing Co., Ltd., Kyoko (JP)

( * ) Notice: Subject to any disclaimer, the term of this patent is extended or adjusted under 35 U.S.C. 154(b) by 0 days.

(21) Appl. No.: 10/026,528

(22) Filed: Dec. 27, 2001

(65) Prior Publication Data

US 2002/0093397 A1 Jul. 18, 2002

(30) Foreign Application Priority Data

Jan. 12, 2001 (JP) ....................................... 2001-005647

(51) Int. Cl.[7] ................................................. H03H 7/01
(52) U.S. Cl. ....................................... 333/175; 333/185
(58) Field of Search ................................ 333/175, 177, 333/184, 185, 204

(56) References Cited

U.S. PATENT DOCUMENTS 5,404,118 A * 4/1995 Okamura et al. ........... 333/175
5,777,533 A * 7/1998 Kato et al. .................. 333/185
5,977,845 A * 11/1999 Kitahara ..................... 333/184
6,115,234 A * 9/2000 Ishii et al. .................. 333/185
6,417,745 B1 * 7/2002 Taniguchi ................... 333/185

* cited by examiner

*Primary Examiner*—Seungsook Ham
(74) *Attorney, Agent, or Firm*—Keating & Bennett, LLP

(57) ABSTRACT

A lamination type LC filter includes a laminated body in which inductor electrodes, capacitor electrodes, and internal ground electrodes constituting a resonance circuit are laminated through dielectric sheets. The inductor electrodes have bent shapes or curved shapes and a first end portion of the inductor electrodes is located in the vicinity of the central portion of the dielectric sheets, the middle portion thereof is located in the vicinity of the end portion of the dielectric sheets, and the second end portion thereof is located in the vicinity of the central portion of the dielectric sheets. The capacitance electrodes and the internal ground electrodes are preferably strip-shaped in the vicinity of the central portion of the dielectric sheets and are stacked one on top of another so as to be substantially parallel to each other.

12 Claims, 10 Drawing Sheets

LAMINATION TYPE LC FILTER

BACKGROUND OF THE INVENTION

1. Field of the Invention

The present invention relates to a lamination type LC filter.

2. Description of the Related Art

Conventionally, among filters used in portable telephones and other electronic apparatuses, a lamination type LC filter is known. The lamination type LC filter is a chip electronic component including inductor electrodes and capacitor electrodes that constitute a resonance circuit and are laminated through dielectric sheets. Such a component is suitable for miniaturization.

Such a lamination type LC filter is shown in FIGS. 14 to 16. FIG. 14 is an exploded perspective view of a conventional lamination type LC filter, FIG. 15 is a perspective appearance of the LC filter, and FIG. 16 is an equivalent circuit diagram of the LC filter.

As shown in FIG. 14, the lamination type LC filter 1 includes a dielectric sheet 3*a* on the surface of which an internal ground electrode 2 is provided, a dielectric sheet 3*b* on the surface of which inductor electrodes 4*a* and 4*b* are provided, a dielectric sheet 3*c* on the surface of which an input capacitor electrode 5*a* and an output capacitor electrode 5*b* are provided, a dielectric sheet 3*d* on the surface of which resonance capacitor electrodes 6*a* and 6*b* are provided, a dielectric sheet 3*e* on the surface of which an internal ground electrode 7 is provided, and a dielectric sheet 3*f* constituting an external layer.

Each internal electrode is made of Ag, Pd, Cu, Ni, Au, or Ag—Pd, and is formed via printing, sputtering, or evaporation. Furthermore, a dielectric powder mixed and kneaded together with a binder, is made into sheets which are used as the dielectric sheets 3*a* to 3*f*.

The internal ground electrode 2 is formed on substantially the entire area, excluding the left and right end portions, of the surface of the dielectric sheet 3*a*, such that a first end portion 2*a* of the internal ground electrode 2 is exposed at the front of the dielectric sheet 3*a,* and a second end portion 2*b* is exposed at the rear thereof.

The inductor electrodes 4*a* and 4*b* include a spiral coil of about two turns, the inductor electrode 4*a* is provided at a left portion of the dielectric sheet 3*b,* and the inductor electrode 4*b* is provided at a right portion of the dielectric sheet 3*b*. A first end portion $4a_1$ of the inductor electrode 4*a* is connected to the resonance capacitor 6*a* through a via hole, and a second end portion $4a_2$ of the inductor electrode 4*a* is connected to the internal ground electrode 2 through another via hole. In the same way, the first end portion $4b_1$ of the inductor electrode 4*b* is connected to the resonance capacitor 6*b* through a via hole, and the second end portion $4b_2$ of the inductor electrode 4*b* is connected to the internal ground electrode 2 through another via hole.

In the input capacitor electrode 5*a,* a first end portion $5a_1$ is exposed at a left portion of the dielectric sheet 3*c,* and a second end portion $5a_2$ has a large area and faces the resonance capacitor electrode 6*a* through the dielectric sheet 3*d*. In the same way, in the output capacitor electrode 5*b,* a first end portion $5b_1$ is exposed at the right portion of the dielectric sheet 3*c,* and a second end portion $5b_2$ has a large area and faces the resonance capacitor electrode 6*b* through the dielectric sheet 3*d.*

Both of the resonance capacitor electrodes 6*a* and 6*b* are rectangular and have longer sides extending in the direction from the front to the rear of the dielectric sheet 3*d,* the resonance capacitor electrode 6*a* is provided at a left portion of the dielectric sheet 3*d,* and the resonance capacitor electrode 6*b* is provided at a right portion of the dielectric sheet 3*d.* As described above, the resonance capacitor electrode 6*a* is connected to the first end portion $4a_1$ of the inductor electrode 4*a* through a via hole and faces the input capacitor electrode 5*a.* In the same way, the resonance capacitor electrode 6*b* is connected to the first end portion $4b_1$ of the inductor electrode 4*b* through a via hole and faces the input capacitor electrode 5*b.*

The internal ground electrode 7 is formed along substantially the entire area, excluding the left and right end portions, of the surface of the dielectric sheet 3*e*, such that a first end portion 7*a* is exposed at the front of the dielectric sheet 3*e,* and a second end portion 7*b* is exposed at the rear of the dielectric sheet 3*e.*

Each dielectric sheet having the above-described construction is put one on top of another in order, and then they are integrally fired to form a laminated body.

Next, as shown in FIG. 15, external ground electrodes 8*a* and 8*b* are formed on the front and rear surfaces of the obtained laminated body, respectively. Furthermore, an external input electrode 9*a* and an external output electrode 9*b* are formed on the left and right surfaces of the laminated body, respectively. Each external electrode is formed by means of coating, baking, sputtering, and evaporation. Then, a first end portion 2*a* of the internal ground electrode 2 and a first end portion 7*a* of the internal ground electrode 7 are connected to the external ground electrode 8*a,* and the second end portion 2*b* and the second end portion 7*b* of the internal ground electrode 7 are connected to the external ground electrode 8*b.* Furthermore, the first end portion $5a_1$ of the input capacitor electrode 5*a* is connected to the external input electrode 9*a,* and the first end portion $5b_1$ of the output capacitor electrode 5*b* is connected to the external output electrode 9*b.*

The lamination type LC filter 1 described above constitutes the equivalent circuit diagram of a bandpass filter as shown in FIG. 16. That is, an inductance $L_1$ generated by the inductor electrode 4*a* and a capacitance $C_1$ generated between the resonance capacitor electrode 6*a* and the internal ground electrode 7 are connected in parallel and constitute a parallel LC resonance circuit $Q_1$ on the input side. In the same way, an inductance $L_2$ generated by the inductor electrode 4*b* and a capacitance $C_2$ generated between the resonance capacitor electrode 6*b* and the internal ground electrode 7 are connected in parallel and constitute a parallel LC resonance circuit $Q_2$ on the output side. Then, a mutual inductance M is formed between the inductance $L_1$ and the inductance $L_2$, and the parallel LC resonance circuits $Q_1$ and $Q_2$ are magnetically coupled.

Furthermore, a capacitance formed by a capacitive coupling between the second end portion $5a_2$ of the input capacitor electrode 5*a* and the resonance capacitor electrode 6*a* is connected in series to the parallel resonance circuit $Q_1$ to constitute an input adjustment capacitance $C_3$. In the same way, a capacitance formed by a capacitive coupling between the second end portion $5b_2$ of the output capacitor electrode 5*b* and the resonance capacitor electrode 6*b* is connected in series to the parallel resonance circuit $Q_2$ to constitute an output adjustment capacitance $C_4$.

Here, in a perspective view, when the above-described lamination type LC filter 1 is seen in the direction of an arrow A in FIG. 15 (from the top), the input capacitor electrode 5*a* located above the inductor electrode 4*a* is disposed inside the inductor electrode 4*a,* the resonance capacitor electrode 6*a* is disposed so as to completely cover the inductor electrode 4*a,* and the internal ground electrode 7 is disposed so as to completely cover the inductor electrode 4*a*. On the other hand, the internal ground electrode 2 below the inductor electrode 4*a* is disposed so as to completely enclose the inductor electrode 4*a*.

In the same way, the second end portion $5b_2$ of the output capacitor electrode 5*b* located above the inductor electrode 4*b* is disposed inside the inductor electrode 4*b*, the resonance capacitor electrode 6*b* is disposed so as to completely cover the inductor electrode 4*b,* and the internal ground electrode 7 is disposed so as to completely cover the inductor electrode 4*b*. On the other hand, the internal ground electrode 2 located below the inductor electrode 4*b* is disposed so as to completely enclose the inductor electrode 4*b*.

In keeping with the trend toward producing smaller and more low-profile electronic components, in the construction of conventional lamination type LC filters, the input-output capacitor electrodes, the resonance capacitor electrodes, the internal ground electrodes, and other elements, which constitute capacitance are located close to the inductor electrodes. Also, the magnetic field generated by the inductor electrodes is interrupted by these internal electrodes, and the Q characteristics of the inductor electrodes deteriorate. Consequently, these disadvantages prevent making the lamination type LC filters smaller and more low-profile.

SUMMARY OF THE INVENTION

In order to overcome the problems described above, preferred embodiments of the present invention provide a lamination type LC filter in which the interruption of a magnetic field generated by the inductor electrodes is prevented by the other internal electrodes constituting capacitance, thus producing greatly improved filtering characteristics.

A lamination type LC filter according to a preferred embodiment of the present invention includes a laminated body in which inductor electrodes, capacitor electrodes, and internal ground electrodes constituting a resonance circuit are laminated through dielectric sheets. In the lamination type LC filter, the inductor electrodes preferably have a bent shape or a curved shape. A first end portion of the inductor electrodes is located in the vicinity of the central portion of the dielectric sheets, a middle portion thereof is located in the vicinity of the end portion of the dielectric sheets, and a second end portion thereof is located in the vicinity of the central portion of the dielectric sheets. The capacitor electrodes and the internal ground electrodes are preferably strip-shaped in the vicinity of the central portion of the dielectric sheets and are stacked on top of another so as to be substantially parallel to each other.

With the unique construction described above, in a perspective view when the lamination type LC filter is seen from the top, in the inductor electrodes, since the first end portion and the second end portion of the inductor electrodes are located in the vicinity of the central portion of the dielectric sheet and the middle portions of the inductor electrodes are located in the vicinity of the end portion, the portion in which the inductor electrodes overlap with the capacitor electrodes and the internal ground electrodes having the strip-shaped configuration in the vicinity of the central portion is very small. Therefore, a magnetic field generated by the inductor electrodes is minimized by the other internal electrodes.

Furthermore, a lamination type LC filter according to another preferred embodiment of the present invention includes a laminated body in which inductor electrodes, capacitor electrodes, and internal ground electrodes constituting a resonance circuit are laminated through dielectric sheets. In the lamination type LC filter, the inductor electrodes preferably have a bent shape or a curved shape. A first end portion of the inductor electrodes is located in the vicinity of the central portion of the dielectric sheets, a middle portion thereof is located in the vicinity of the end portion of the dielectric sheets, and a second end portion thereof is located in the vicinity of the central portion of the dielectric sheets. The capacitor electrodes and the internal ground electrodes preferably have a strip-shaped configuration in the vicinity of the end portion of the dielectric sheets and are stacked on top of another so as to be substantially parallel to each other.

With the unique construction described above, in a perspective view when the lamination type LC filter is seen from the top, in the inductor electrodes, since the first end portion and the second end portion are located in the vicinity of the central portion of the dielectric sheets and the middle portion is provided in the vicinity of the end portion, the portion in which the inductor electrodes overlap with the capacitor electrodes and the internal ground electrodes having the strip-shaped configuration in the vicinity of the end portion is very small. Therefore, a magnetic field generated by the inductor electrodes is minimized by the other internal electrodes.

Moreover, in a lamination type LC filter according to another preferred embodiment of the present invention, external ground electrodes to be connected to the internal ground electrodes are provided on the side surfaces of the laminated body and the external ground electrodes preferably have substantially the same width as that of the internal ground electrodes.

With above-described unique construction, when the internal ground electrodes are located in the vicinity of the central portion of the dielectric sheets and have a strip-shaped configuration, the external ground electrodes are also located in the vicinity of the central portion so as to have substantially the same width. Therefore, the first end portion and the second end portion of the inductor electrodes are provided in the vicinity of the central portion, and the portion in which the internal ground electrodes overlap with the inductor electrodes, the middle portion of which is provided so as to go around in the vicinity of the end portion, is very small. Therefore, a magnetic field generated by the inductor electrodes is minimized by the other internal electrodes.

Furthermore, when the internal ground electrodes are located in the vicinity of the end portions of the dielectric sheets, the external ground electrodes are also located in the vicinity of the end portions so as to have substantially the same width. Therefore, the first end portion and the second end portion of the inductor electrodes are provided in the vicinity of the central portion, and the portion in which the external ground electrodes overlap with the internal electrodes, the middle portion of which is provided so as to go around in the vicinity of the end portion, is very small. Therefore, a magnetic field generated by the inductor electrodes is minimized by the other internal electrodes.

Other features, elements, characteristics and advantages of the present invention will become more apparent from the following detailed description of preferred embodiments with reference to the attached drawings.

DETAILED DESCRIPTION OF PREFERRED EMBODIMENTS

A first preferred embodiment of a lamination type LC filter according to the present invention is described with reference to FIGS. 1–4.

Figure 1:
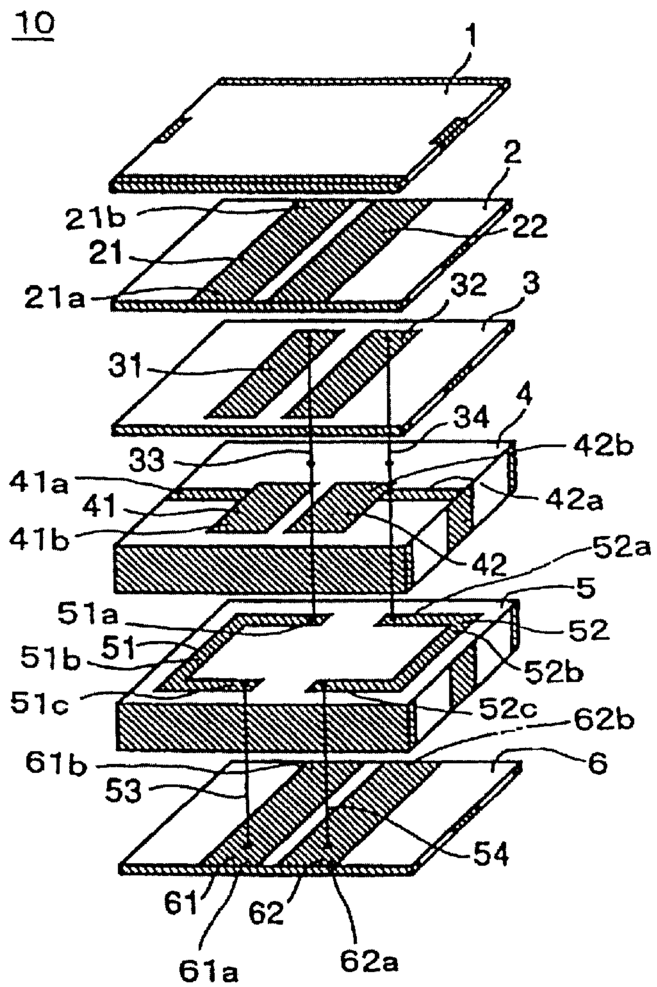
FIG. 1 is an exploded perspective view showing a preferred embodiment of a lamination type LC filter according to the present invention.
Figure 2:
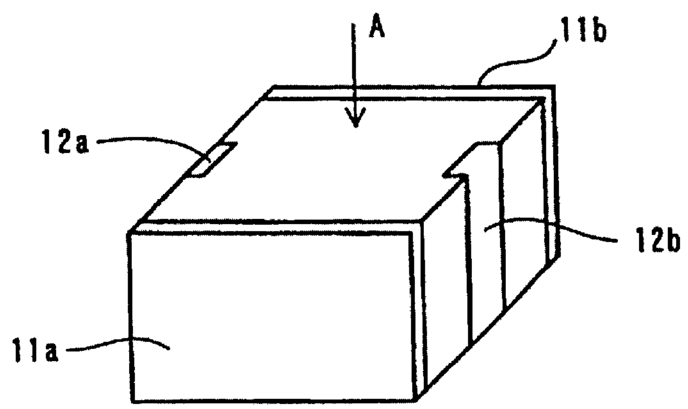
FIG. 2 is a perspective appearance of the lamination type LC filter of FIG. 1.
Figure 3:
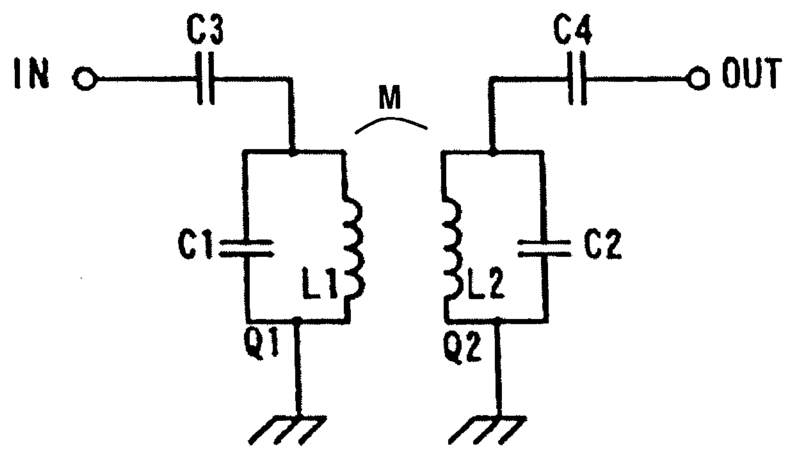
FIG. 3 is an equivalent circuit diagram of the lamination type LC filter of FIG. 1.
Figure 4:
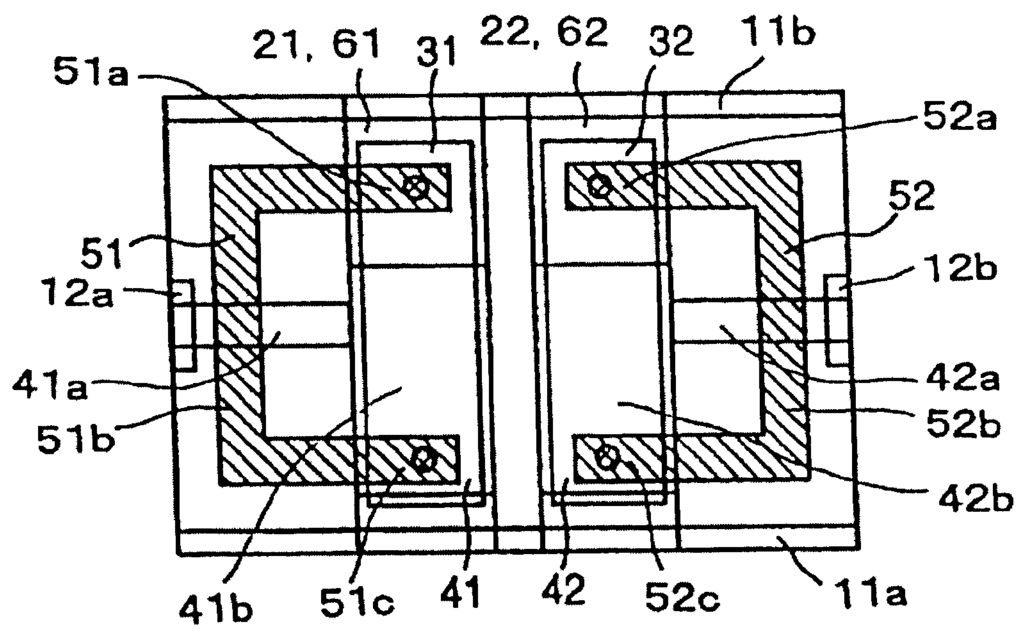
FIG. 4 is a perspective diagram when the lamination type LC filter of FIG. 1 is seen in the direction of an arrow A in FIG. 2 (from the top)

FIG. 1 is an exploded perspective view showing a preferred embodiment of a lamination type LC filter according to the present invention, FIG. 2 is a perspective appearance of the lamination type LC filter of FIG. 1, FIG. 3 is an equivalent circuit diagram of the lamination type LC filter of FIG. 1, and FIG. 4 is a perspective diagram when the lamination type LC filter of FIG. 1 is seen in the direction of an arrow A in FIG. 2 (from the top).

As shown in FIG. 1, the lamination type LC filter 10 preferably includes a dielectric sheet 6 on the surface of which internal ground electrodes 61 and 62 are provided, a dielectric sheet 5 on the surface of which inductor electrodes 51 and 52 are provided, a dielectric sheet 4 on the surface of which an input capacitor electrode 41 and an output capacitor electrode 42 are provided, a dielectric sheet 3 on the surface of which resonance capacitor electrodes 31 and 32 are provided, a dielectric sheet 2 on the surface of which internal electrodes 21 and 22 are provided, and a dielectric sheet constituting an external layer.

Each internal electrode is preferably formed by printing a paste in which a metal powder such as Ag, Pd, Cu, Ni, Au, Ag—Pd, or other suitable material, is mixed and kneaded with an organic binder, a solvent, and other suitable materials. Moreover, the internal electrode may be formed by means of sputtering, evaporation, or other suitable processes, which are generally known. Furthermore, a dielectric slurry in which a dielectric powder is mixed and kneaded together with an organic binder, a solvent, or other suitable additives, is made into sheets and these sheets are used as the dielectric sheets 1 to 6.

The internal ground electrode 61 is preferably strip-shaped and has longer sides extending in the direction from the front to the rear of the dielectric sheet 6, and a first end portion 61*a* is exposed at the front of the dielectric sheet 6, and a second end portion 61*b* is exposed at the rear thereof. In the same way, the internal ground electrode 62 is preferably strip-shaped and has longer sides extending in the direction from the front to the rear of the dielectric sheet 6, and a first end portion 62*a* is exposed at the front of the dielectric sheet 6, and a second end portion 62*b* is exposed at the rear thereof. The internal ground electrode 61 is provided at a left portion in the vicinity of the central portion of the dielectric sheet 6, and the internal ground electrode 62 is provided at a right portion in the vicinity of the central portion.

The inductor electrode 51 preferably includes a substantially U-shaped bending coil pattern. A first end portion 51*a* of the inductor electrode 51 is provided at the rear portion in the vicinity of the central portion of the dielectric sheet 5, a middle portion 51*b* extends around the end portion in the vicinity of the end portion of the dielectric sheet 5, and a second end portion 51*c* is provided at the front portion in the vicinity of the central portion.

Furthermore, the inductor electrode 52 preferably includes a substantially U-shaped bending coil pattern. A first end portion 52*a* of the inductor electrode 52 is provided at the rear portion in the vicinity of the central portion of the dielectric sheet 5, a middle portion 52*b* extends around the end portion in the vicinity of the end portion of the dielectric sheet 5, and a second end portion 52*c* is provided at the front portion in the vicinity of the central portion. Therefore, the inductor electrode 51 and the inductor electrode 52 are arranged so as to face each other such that the open ends of the substantially U-shaped patterns face each other.

The first end portion 51*a* of the inductor electrode 51 is connected to the resonance capacitor 31 through a via hole, and the second end portion 51*c* of the inductor electrode 51 is connected to the internal ground electrode 61 through another via hole. In the same way, the first end portion 52*a* of the inductor electrode 52 is connected to the resonance capacitor 32 through a via hole, and the second end portion 52*c* of the inductor electrode 52 is connected to the internal ground electrode 62 through another via hole.

Moreover, the dielectric sheets 4 and 5 above and below the inductor electrodes 51 and 52 are preferably thicker than the other dielectric sheets in consideration of the electromagnetic interference between the inductor electrodes and the other internal electrodes.

In the input capacitor electrode 41, the first end portion 41*a* is exposed at the left portion of the dielectric sheet 4 and the second end portion 41*b* has a large area on the front portion thereof, and the input capacitor electrode 41 faces the resonance capacitor electrode 31 through the dielectric sheet 3. In the same way, in the output capacitor electrode 42, the first end portion 42*a* is exposed at the right portion of the dielectric sheet 4 and the second end portion 42*b* is has a large area on the front portion, and the input capacitor electrode 4 faces the resonance capacitor electrode 32 through the dielectric sheet 3.

The resonance capacitor electrodes 31 and 32 are preferably strip-shaped and have longer sides extending in the direction from the front to the rear of the dielectric sheet 3, the resonance capacitor electrode 31 is provided at a left location in the vicinity of the central portion of the dielectric sheet 3, and the resonance capacitor electrode 32 is provided at a right portion in the vicinity of the central portion of the dielectric sheet 3. As described above, the resonance capacitor electrode 31 is connected to the first end portion 51*a* of the inductor electrode 51 and faces the second end portion 41*b* of the input capacitor electrode 41. In the same way, the resonance capacitor electrode 32 is connected to the first end portion 52*a* of the inductor electrode 52 and faces the second end portion 42*b* of the input capacitor electrode 42.

The internal ground electrode 21 is preferably strip-shaped and has longer sides extending in the direction from the front to the rear of the dielectric sheet 2, and a first end portion 21*a* is exposed at the front portion, and a second end portion 21*b* is exposed at the rear portion. In the same way, the internal ground electrode 22 is preferably strip-shaped and has longer sides extending in the direction from the front to the rear of the dielectric sheet 2, and a first end portion 22*a* is exposed at the front portion, and a second end portion 22*b* is exposed at the rear portion. The internal ground electrode 21 is provided at a left portion in the vicinity of the central portion of the dielectric sheet 2, and the internal ground electrode 22 is provided at a right portion in the vicinity of the central portion.

Each dielectric sheet having the above-described construction is stacked one on top of another in order, and then they are integrally fired to produce a laminated body. Next, as shown in FIG. 2, external ground electrodes 11*a* and 11*b* are formed preferably on the entire surface of the front and rear surfaces of the laminated body, respectively, and an external input electrode 12*a* and an external output electrode 12*b* preferably include a strip-shaped electrode disposed on the surface of the left and right portions of the laminated body, respectively. Moreover, each external electrode is preferably formed by coating, baking, sputtering, evaporation, or other suitable processes.

First end portions 61*a*, 62*a*, 21*a*, and 22*a* of the internal ground electrodes 61, 62, 21, and 22 are connected to the external ground electrode 11*a*, and second end portions 61*b*, 62*b*, 21*b*, and 22*b* of the internal ground electrodes 61, 62, 21, and 22 are connected to the external ground electrode 11*b*. Furthermore, a first end portion 41*a* of the input capacitor electrode 41 is connected to the external input electrode 12*a*, and a second end portion 42*a* of the input capacitor electrode 42 is connected to the external output electrode 12*b*.

The lamination type LC filter 10 described above constitutes the equivalent circuit diagram of a bandpass filter as shown in FIG. 3. That is, an inductance L, generated by the inductor electrode 51 and a capacitance C, generated between the resonance capacitor electrode 31 and the internal ground electrode 21 are connected in parallel and constitute a parallel LC resonance circuit $Q_1$. In the same way, an inductance $L_2$ generated by the inductor electrode 52 and a capacitance $C_2$ generated between the resonance capacitor electrode 32 and the internal ground electrode 22 are connected in parallel and constitute a parallel LC resonance circuit $Q_2$. Then, a mutual inductance M is generated between the inductance $L_1$ and the inductance $L_2$, and the parallel LC resonance circuits $Q_1$ and $Q_2$ are magnetically coupled.

Furthermore, a capacitance generated by a capacitive coupling between the second end portion 41*b* of the input capacitor electrode 41 and the resonance capacitor electrode 31 is connected in series to the parallel LC resonance circuit $Q_1$ to constitute an input adjustment capacitance $C_3$. In the same way, a capacitance generated by a capacitive coupling between the second end portion 42*b* of the output capacitor electrode 42 and the resonance capacitor electrode 32 is connected in series to the parallel LC resonance circuit $Q_2$ to constitute an output adjustment capacitance $C_4$.

Here, FIG. 4 is a perspective view when the above-described lamination type LC filter 10 is seen in the direction of an arrow A in FIG. 2 (from the top). The resonance capacitor electrode 31, the internal ground electrode 21, and the internal ground electrode 61 are disposed above and below a first end portion 51*a* of the inductor electrode 51 such that each of them is arranged substantially perpendicularly to the first end portion 51*a* and such that they are stacked one on top of another so as to be substantially parallel each other.

Furthermore, the second end portion 41*b* of the input capacitor electrode 41, the resonance capacitor electrode 31, the internal ground electrode 21, and the internal ground electrode 61 are disposed above and below the second end portion 51*c* of the inductor electrode 51 such that each of them is arranged substantially perpendicularly to the second end portion 51*c* and such that they are stacked one on top of another to be substantially parallel each other.

On the other hand, only the first end portion 41*a* of the input capacitor electrode 41 which is arranged substantially perpendicularly to the middle portion 51*b* of the inductor electrode 51 is above the middle portion 51*b*, and the other internal electrodes such as the input capacitor electrode 41, the resonance capacitor electrode 31, or the internal ground electrode 21 constituting a capacitance is not disposed above the middle portion 51*b*. Furthermore, the other internal electrodes constituting a capacitance also are not disposed below the middle portion 51*b* of the inductor electrode 51.

Therefore, the inductor electrode 51 does not overlap one half or more in area with the other internal electrodes in the perspective view of FIG. 4.

In the same way, the resonance capacitor electrode 32, the internal ground electrode 22, and the internal ground electrode 62 are disposed above and below a first end portion 52*a* of the inductor electrode 52 such that each of them is substantially perpendicular to the first end portion 52*a* and such that they are stacked one on top of another to be substantially parallel to each other.

Furthermore, the second end portion 42*b* of the output capacitor electrode 42, the resonance capacitor electrode 32, the internal ground electrode 22, and the internal ground electrode 62 are disposed above and below the second end portion 52*c* of the inductor electrode 52 such that each of them is substantially perpendicular to the second end portion 52*c* and they are stacked one on top of another to be substantially parallel to each other.

On the other hand, only the first end portion 42*a* of the output capacitor electrode 42 which is arranged substantially perpendicularly to the middle portion 52*b* of the inductor electrode 52 is above the middle portion 52*b*, and the other internal electrodes such as the output capacitor electrode 42, the resonance capacitor electrode 32, or the internal ground electrode 22 constituting a capacitance is not disposed above the middle portion 52*b*. Furthermore, the other internal electrodes constituting a capacitance are not disposed below the middle portion 51*b* of the inductor electrode 51.

Therefore, the inductor electrode 52 does not overlap one half or more in area with the other internal electrodes in the perspective view of FIG. 4.

Because of the unique construction described above, in the inductor electrodes 51 and 52, although a first end portion and a second end portion overlap with the other internal electrodes constituting a capacitance, since the middle portion does not overlap with the other internal electrodes, it is possible to minimize the interruption of a magnetic field generated by the inductor electrodes by the other internal electrodes. Furthermore, in the above-described preferred embodiment of the present invention, the dimension of the width of the ground electrodes 61 and 62 can be properly and easily selected. In this way, by properly adjusting the width of the ground electrodes 61 and 62 connected to the inductor electrodes to move poles (attenuation poles) formed on the high frequency side of the passband to a high-frequency region or a low-frequency region, it becomes possible to adjust the frequency characteristics of a bandpass filter.

Figure 5:
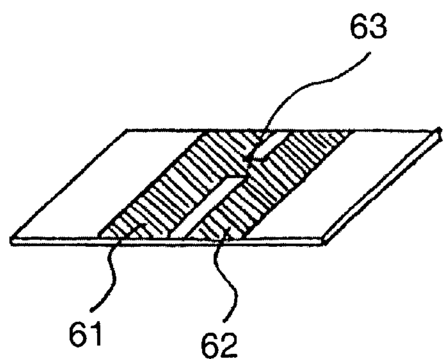
FIG. 5 is a perspective view of another preferred embodiment of a ground electrode of the lamination type LC filter shown in FIG. 1.

Moreover, in the above-described preferred embodiment, the ground electrodes 61 and 62 are preferably strip-shaped along a direction from the front to the rear of the dielectric sheet 6 and they are not connected to each other, but, as shown in FIG. 5, the ground electrodes 61 and 62 may be connected by a connection pattern 63.

When the ground electrodes 61 and 62 are connected by the connection pattern 63 in this way, the parallel LC resonance circuit $Q_1$ on the input side and the parallel LC resonance circuit $Q_2$ on the output side are also coupled by the coil, except that they are magnetically coupled as described above. As a result, it becomes possible to adjust the bandwidth of the bandpass filter.

Figure 6:
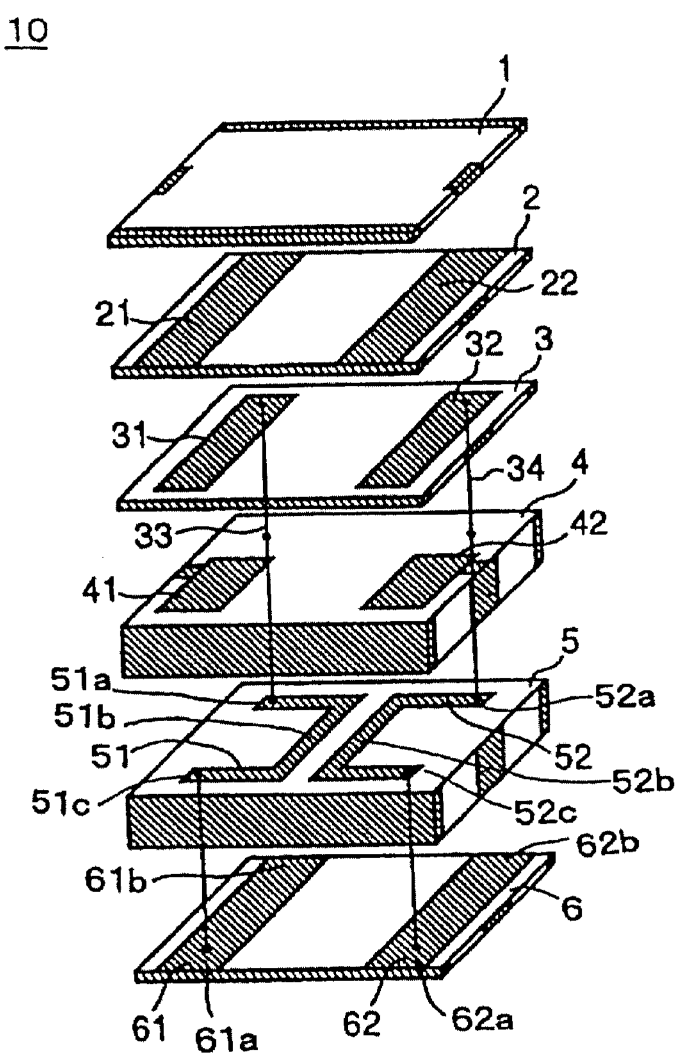
FIG. 6 is an exploded perspective view showing a second preferred embodiment of a lamination type LC filter according to the present invention.
Figure 7:
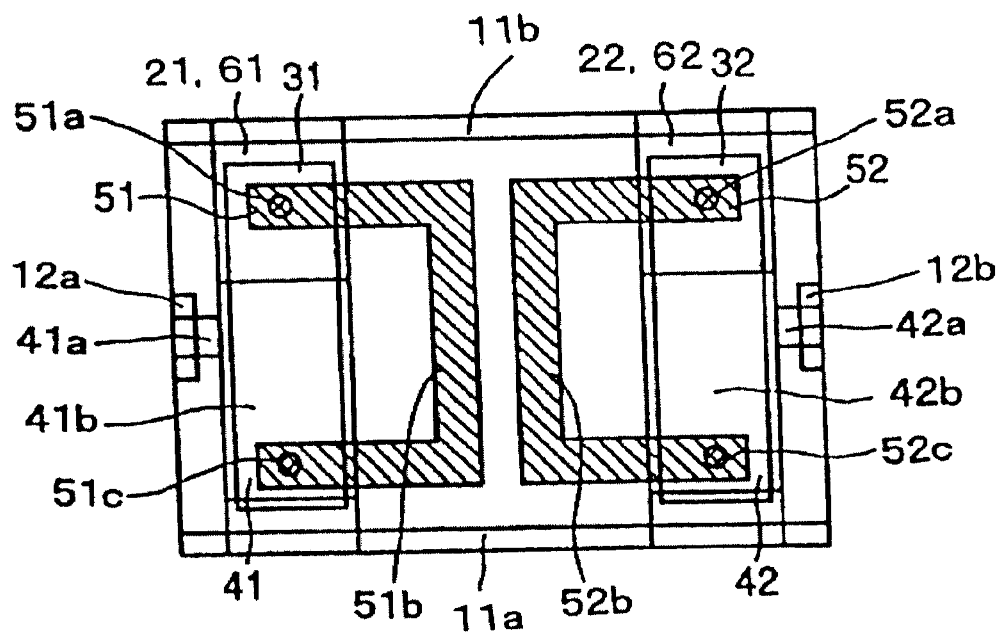
FIG. 7 is a perspective diagram when the lamination type LC filter of FIG. 6 is seen in the same direction as an arrow A in FIG. 2 (from the top)

FIG. 6 is an exploded perspective view showing another preferred embodiment of a lamination type LC filter according to the present invention, and FIG. 7 is a perspective diagram when the lamination type LC filter of FIG. 6 is seen in the same direction as an arrow in FIG. 2 (from the top).

The second preferred embodiment is different from the first preferred embodiment in that the arrangement of the internal ground electrodes 61, 62, 21, and 22 and the shape of the inductor electrodes 51 and 52 are changed. The other features and characteristics of the second preferred embodiment are preferably the same as in the first preferred embodiment and accordingly the explanation thereof is omitted.

As shown in FIG. 6, the internal ground electrode 61 is preferably strip-shaped and has longer sides extending in the direction from the front to the rear of the dielectric sheet 6. A first end portion 61*a* of the internal ground electrode 61 is exposed at the front of the dielectric sheet 6, and the second end portion 61*b* is exposed at the rear of the dielectric sheet 6. In the same way, the internal ground electrode 62 is preferably strip-shaped and has longer sides extending in the direction from the front to the rear of the dielectric sheet 6. A first end portion 62*a* of the internal ground electrode 62 is exposed at the front of the dielectric sheet 6, and the second end portion 62*b* is exposed at the rear of the dielectric sheet 6. The internal ground electrode 61 is provided in the vicinity of the left end portion of the dielectric sheet 6, and the internal ground electrode 62 is provided in the vicinity of the right end portion.

The inductor electrode 51 preferably includes a substantially U-shaped bending coil pattern, with a first end portion 51*a* being provided in the vicinity of the end portion at the rear of the dielectric sheet 5, the middle portion 51*b* extending around the central portion of the dielectric sheet 5, and a second end portion 51*c* being provided in the vicinity of the end portion at the front of the dielectric sheet 5.

Furthermore, the inductor electrode 52 preferably includes a substantially U-shaped bending coil pattern which is opposite to that of the inductor electrode 51. A first end portion 52*a* of the inductor electrode 52 is provided in the vicinity of the end portion at the rear of the dielectric sheet 5, the middle portion 52*b* extends around the central portion of the dielectric sheet 5, and the second end portion 52*c* is provided in the vicinity of the end portion at the front of the dielectric sheet 5. Therefore, the inductor electrode 51 and the inductor electrode 52 are arranged such that the middle portions 51*b* and 52*b* face each other and such that the substantially U-shaped inner portions face in the direction opposite to each other.

The internal ground electrode 21 is preferably strip-shaped and has longer sides extending in the direction from the front to the rear of the dielectric sheet 2. A first end portion 21*a* of the internal ground electrode 21 is exposed at the front of the dielectric sheet 2, and a second end portion 21*b* is exposed at the rear of the dielectric sheet 2. In the same way, the internal ground electrode 22 is preferably strip-shaped and has longer sides extending in the direction from the front to the rear of the dielectric sheet 2. A first end portion 22*a* of the internal ground electrode 22 is exposed at the front of the dielectric sheet 2, and a second end portion 22*b* is exposed at the rear of the dielectric sheet 2. The internal ground electrode 21 is provided in the vicinity of the left end portion of the dielectric sheet 2, and the internal ground electrode 22 is provided in the vicinity of the right end portion of the dielectric sheet 2.

Here, a perspective diagram when the above lamination type LC filter 10 is seen in the same direction as an arrow A in FIG. 2 (from the top) is shown in FIG. 7. The resonance capacitor electrode 31, the internal ground electrode 21, and the internal ground electrode 61 are disposed above and below a first end portion 51*a* of the inductor electrode 51 such that each of them is arranged substantially perpendicularly to the first end portion 51*a* and such that they are stacked one on top of another to be substantially parallel to each other.

Furthermore, the second end portion 41*b* of the input capacitor electrode 41, the resonance capacitor electrode 31, the internal ground electrode 21, and the internal ground electrode 61 are disposed above and below the second end portion 51*c* of the inductor electrode 51 such that each of them is substantially perpendicular to the first end portion 51*c* and such that they are stacked one on top of another to be substantially parallel to each other. On the other hand, the other internal electrodes constituting a capacitance are not disposed above and below the middle portion 51*b* of the inductor electrode 51.

Therefore, the inductor electrode 51 does not overlap one half or more in area with the other internal electrodes in the perspective diagram of FIG. 7.

In the same way, the resonance capacitor electrode 32, the internal ground electrode 22, and the internal ground electrode 62 are disposed above and below a first end portion 52*a* of the inductor electrode 52 such that each of them is substantially perpendicular to the first end portion 52*a* and such that they are stacked one on top of another to be substantially parallel to each other.

Furthermore, the second end portion 42*b* of the output capacitor electrode 42, the resonance capacitor electrode 32, the internal ground electrode 22, and the internal ground electrode 62 are disposed above and below the second end portion 52*c* of the inductor electrode 52 such that each of them is substantially perpendicular to the first end portion 52*c* and such that they are stacked one on top of another to be substantially parallel to each other. On the other hand, the other internal electrodes constituting a capacitance are not disposed above and below the middle portion 52*b* of the inductor electrode 52.

Therefore, the inductor electrode 52 does not overlap one half or more in area with the other internal electrodes in the perspective diagram of FIG. 7.

Because of the unique construction described above, in the inductor electrodes 51 and 52, although a first end portion and a second end portion overlap with the other internal electrodes constituting a capacitance, since the middle portion does not overlap with the other internal electrodes, a magnetic field generated by the inductor electrodes is minimized by the other internal electrodes.

Figure 8:
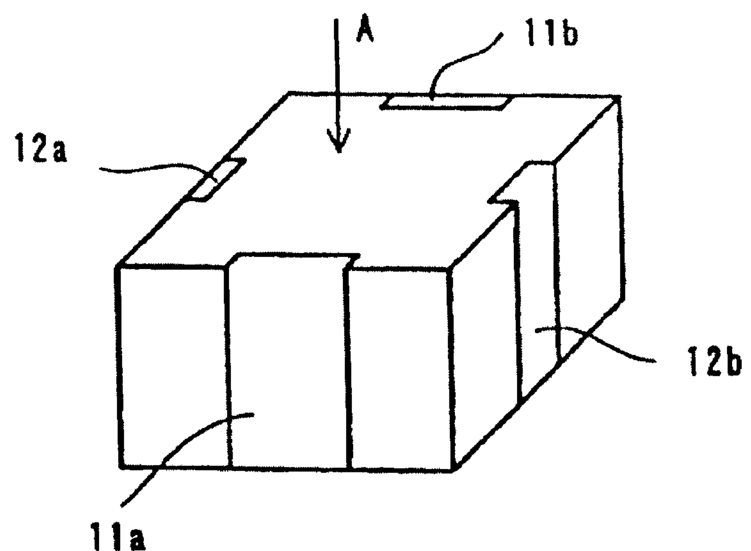
FIG. 8 is a perspective appearance showing a third preferred embodiment of a lamination type LC filter according to the present invention.
Figure 9:
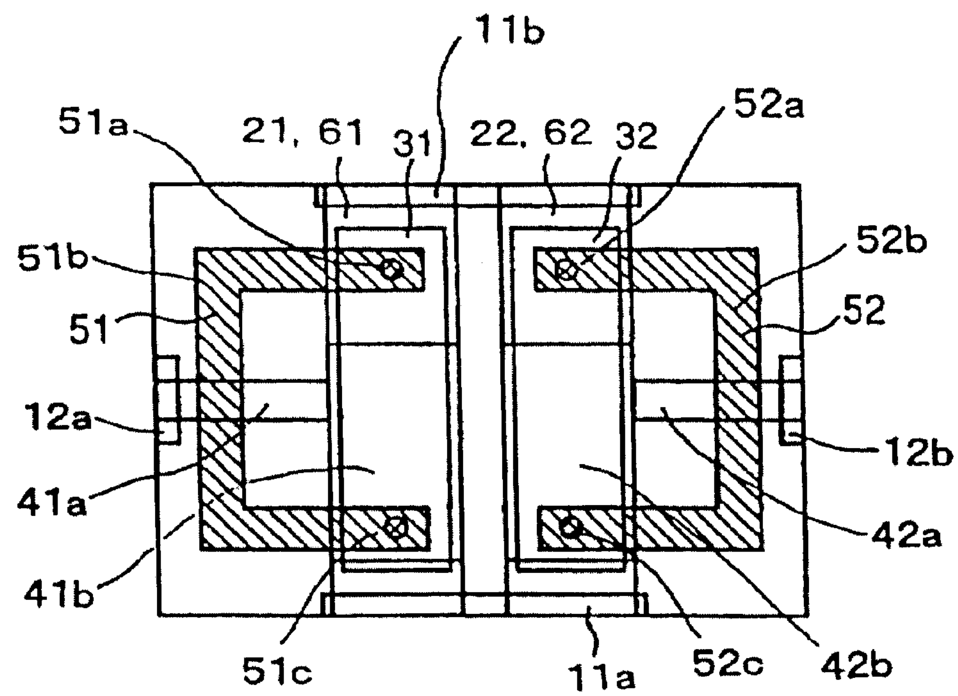
FIG. 9 is a perspective diagram when the lamination type LC filter is seen in the direction of an arrow A in FIG. 8 (from the top)

FIG. 8 is a perspective appearance showing another preferred embodiment of a lamination type LC filter according to the present invention, and FIG. 9 is a perspective diagram when the lamination type LC filter of FIG. 8 is seen in the direction of an arrow A in FIG. 8 (from the top).

The third preferred embodiment is different from the first preferred embodiment in that the shape of the external ground electrodes 11*a* and 11*b* is changed. The other features and characteristics are preferably the same as in the first preferred embodiment and thus, the explanation thereof is omitted.

As shown in FIG. 8, the external ground electrodes 11*a* and 11*b* are provided in the central portion of the front and in the central portion of the rear of the laminated body so as to be strip-shaped, respectively. The width of the external ground electrodes 11*a* and 11*b* is preferably as wide as or slightly wider than the total width of both the internal ground electrodes 61(21) and 62(22) and the space therebetween, as shown in FIG. 9.

Moreover, the internal ground electrodes 61(21) and 62(22) are separately connected to the external ground electrodes 11*a* and 11*b*, respectively, but the internal ground electrodes 61(21) and 62(22) may be connected to each other, for example, in the central portion of the dielectric sheets so as to be substantially H-shaped.

Therefore, in a perspective view when the laminated body is seen from the front or rear, the external ground electrodes 11*a* and 11*b* are arranged such that the internal ground electrodes 61, 62, 21, and 22, the resonance capacitor electrodes 31 and 32, the second end portion 41*b* of the input capacitor electrode 41, the second end portion 42*b* of the output capacitor electrode 42, the first end portion 51*a* and the second end portion 51*c* of the inductor electrode 51, and the first end portion 52*a* and the second end portion 52*c* of the inductor electrode 52 are enclosed by the external ground electrodes 11*a* and 11*b*.

On the other hand, the middle portions 51*b* and 52*b* of the inductor electrodes 51 and 52, the first end portion 41*a* of the input capacitor electrode 41, and the first end portion 42*a* of the output capacitor electrode 42 are not enclosed by the external ground electrodes 11*a* and 11*b*, and these are disposed beyond the external ground electrodes 11*a* and 11*b*.

Therefore, in the perspective diagram of FIG. 9, the inductor electrodes 51 and 52 do not overlap one half or more in area with the other internal electrodes and the external ground electrodes 11*a* and 11*b*.

Because of the unique construction described above, regarding the inductor electrodes 51 and 52, although a first end portion and a second end portion overlap with the other internal electrodes and the external ground electrodes constituting a capacitance, since the middle portion does not overlap with the other internal electrodes and the external ground electrodes, a magnetic field generated by the inductor electrodes is minimized by the other internal electrodes.

Figure 10:
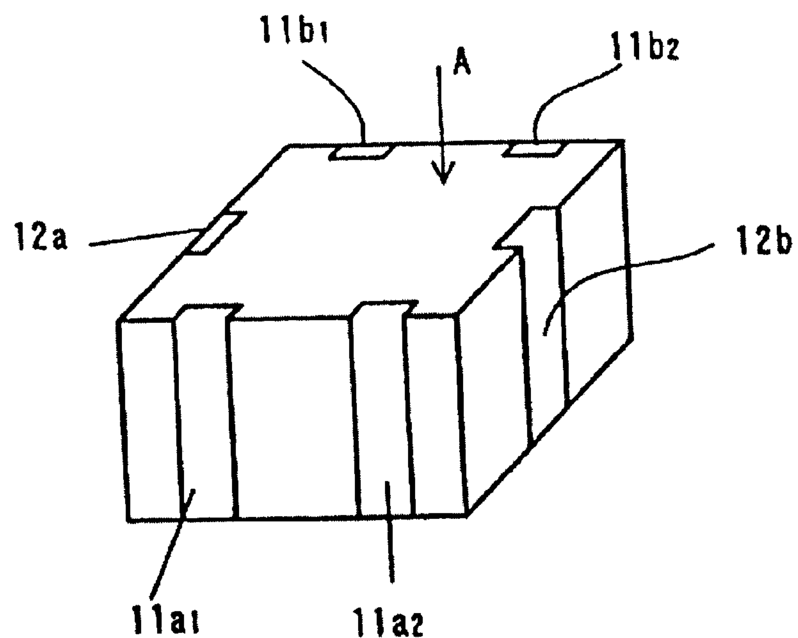
FIG. 10 is a perspective appearance showing a fourth preferred embodiment of a lamination type LC filter according to the present invention.
Figure 11:
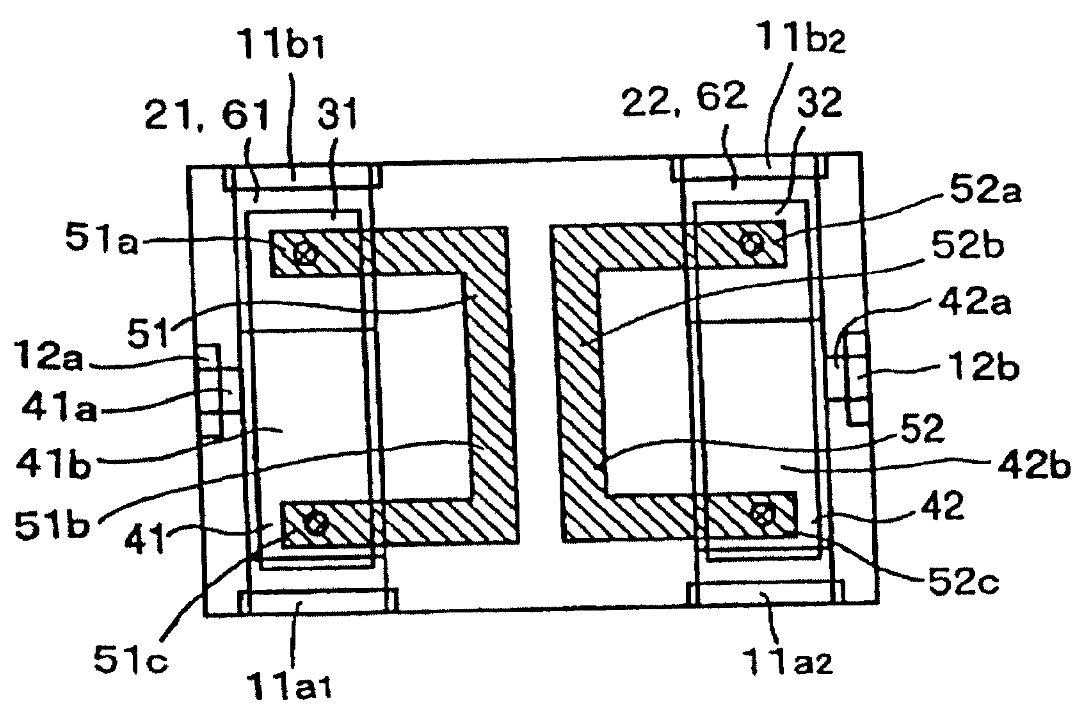
FIG. 11 is a perspective diagram when the lamination type LC filter is seen in the direction of an arrow A in FIG. 10.

FIG. 10 is a perspective appearance showing another preferred embodiment of a lamination type LC filter according to the present invention, and FIG. 11 is a perspective diagram when the lamination type LC filter of FIG. 10 is seen in the direction of an arrow A.

The fourth preferred embodiment is different from the second preferred embodiment in that the shape of the external ground electrodes 11*a* and 11*b* is changed. The other features and characteristics are preferably the same as in the second preferred embodiment and thus, the explanation thereof is omitted.

As shown in FIG. 10, the external ground electrodes $\mathbf{11}a_1$ and $\mathbf{11}a_2$ are located in the vicinity of the end portions of the front of the laminated body. In the same way, the external ground electrodes $\mathbf{11}b_1$ and $\mathbf{11}b_2$ are located in the vicinity of the end portions of the rear of the laminated body so as to be strip-shaped.

The width of the external ground electrodes $\mathbf{11}a_1$, $\mathbf{11}a_2$, $\mathbf{11}b_1$, and $\mathbf{11}b_2$ is preferably the same or slightly wider than the width of the internal ground electrodes 61 and 62.

Therefore, in a perspective view when the laminated body is seen from the front or the rear, the external ground electrodes $\mathbf{11}a_1$ and $\mathbf{11}b_1$ are arranged such that the internal ground electrodes 61 and 62, the resonance capacitor electrode 31, the second end portion 41*b* of the input capacitor electrode 41, and the first end portion 51*a* and the second end portion 51*c* of the inductor electrode 51 are enclosed by the external ground electrodes $\mathbf{11}a_1$ and $\mathbf{11}b_1$.

On the other hand, the middle portion 51*b* of the inductor electrode 51 and the first end portion 41*a* of the input capacitor electrode 41 are not enclosed by the external ground electrodes $\mathbf{11}a_1$ and $\mathbf{11}b_1$, and these elements are disposed beyond the external ground electrodes $\mathbf{11}a_1$ and $\mathbf{11}b_1$.

Therefore, in the perspective diagram of FIG. 11, the inductor electrode 51 does not overlap one half or more in area with the other internal electrodes and the external ground electrodes $\mathbf{11}a_1$ and $\mathbf{11}b_1$.

Furthermore, in a perspective view when the laminated body is seen from the front or the rear side, the external ground electrodes $\mathbf{11}a_2$ and $\mathbf{11}b_2$ are arranged such that the internal electrodes 62 and 22, the resonance capacitor electrode 32, the second end portion 42*b* of the output capacitor electrode 42, and the first end portion 52*a* and the second end portion 52*c* of the inductor electrode 52 are enclosed by the external ground electrodes $\mathbf{11}a_2$ and $\mathbf{11}b_2$.

On the other hand, the middle portion 52*b* of the inductor electrode 52 and the first end portion 42*a* of the input capacitor electrode 42 are not enclosed by the external ground electrodes $\mathbf{11}a_2$ and $\mathbf{11}b_2$, and these are disposed beyond the external ground electrodes $\mathbf{11}a_2$ and $\mathbf{11}b_2$.

Therefore, in the perspective diagram of FIG. 11, the inductor electrode 52 does not overlap one half or more in area with the other internal electrodes and the external ground electrodes 11$a_2$ and 11$b_2$.

Because of the unique construction described above, in the inductor electrodes 51 and 52, although a first end portion and a second end portion overlap with the other internal electrodes and the external ground electrodes constituting a capacitance, since the middle portion does not overlap with the other internal electrodes and the external ground electrodes, a magnetic field generated by the inductor electrodes is minimized by the other internal electrodes.

Figure 12:
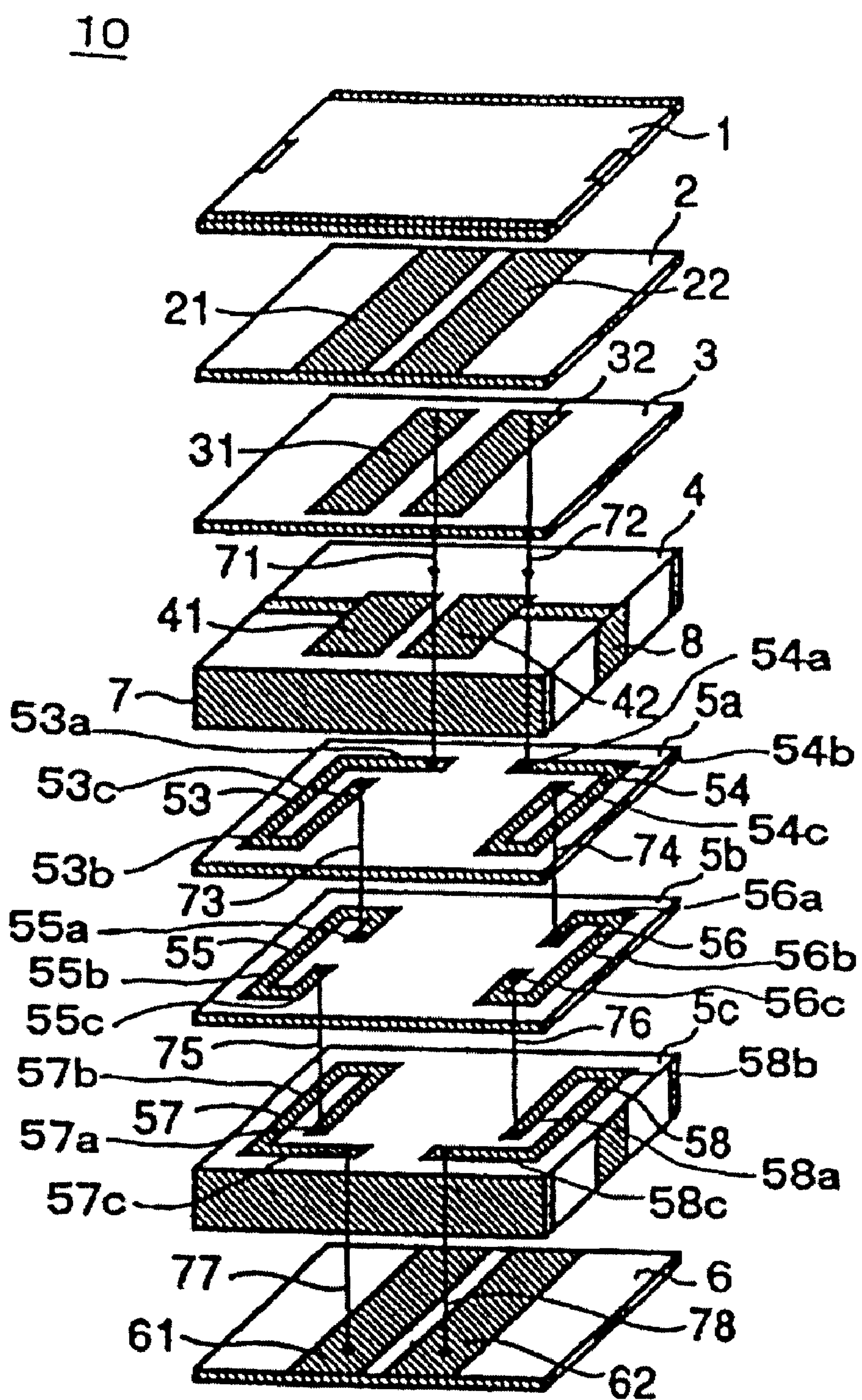
FIG. 12 is an exploded perspective view showing a fifth preferred embodiment of a lamination type LC filter according to the present invention.
Figure 13:
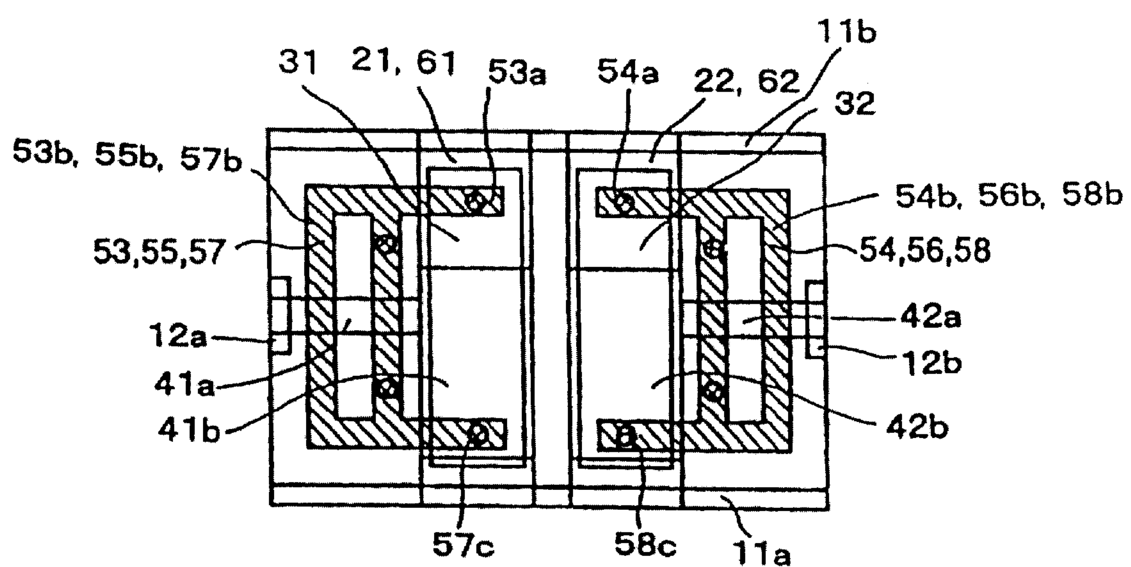
FIG. 13 is a perspective diagram when the lamination type LC filter of FIG. 12 is seen in the direction of an arrow A in FIG. 2 (from the top)
Figure 14:
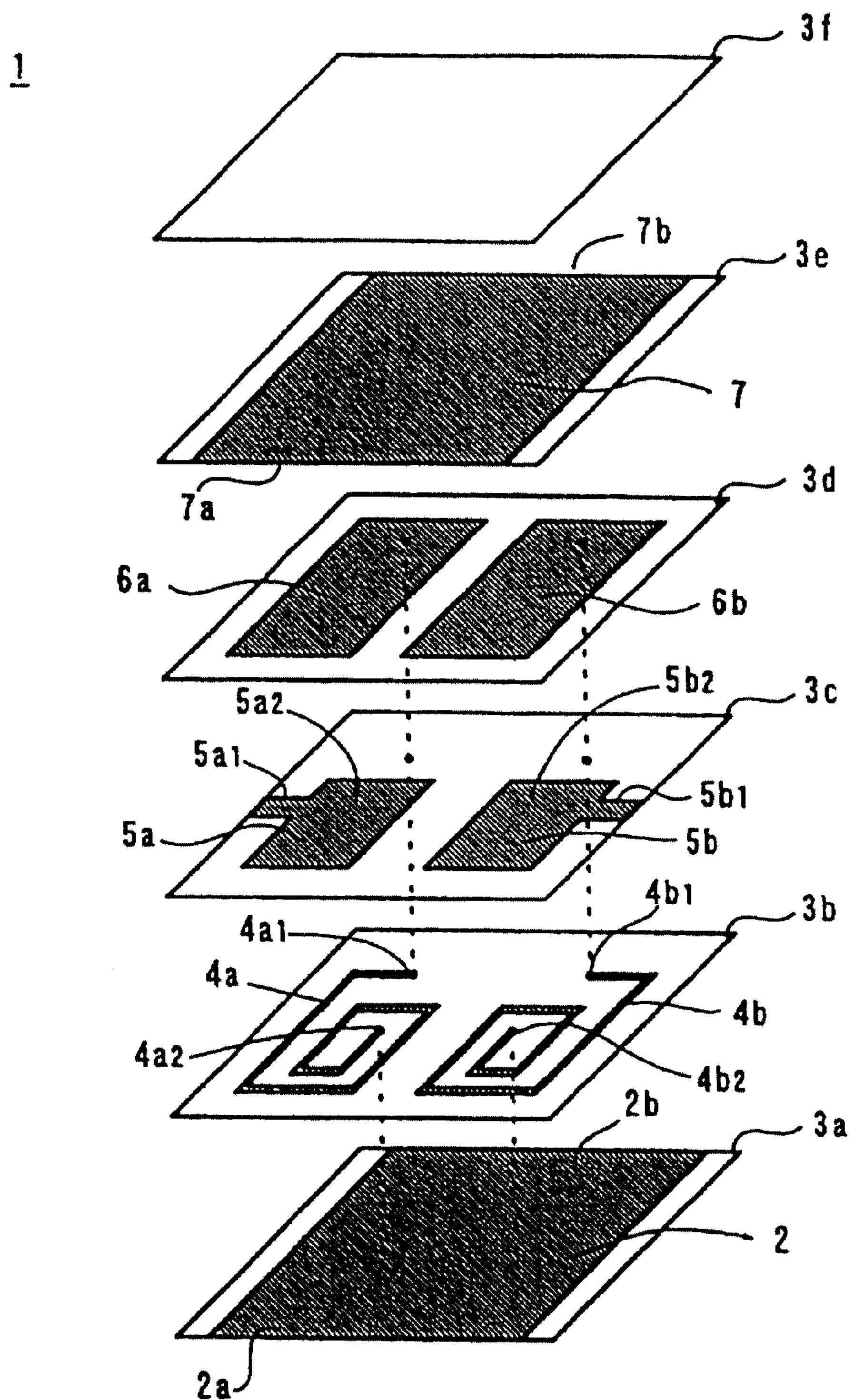
FIG. 14 is an exploded perspective view of a conventional lamination type LC filter.
Figure 15:
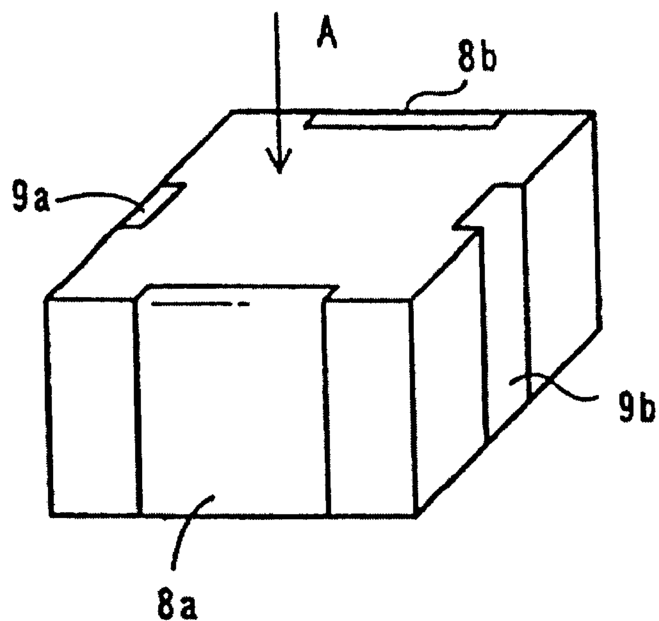
FIG. 15 is a perspective appearance of the lamination type LC filter of FIG. 14.
Figure 16:
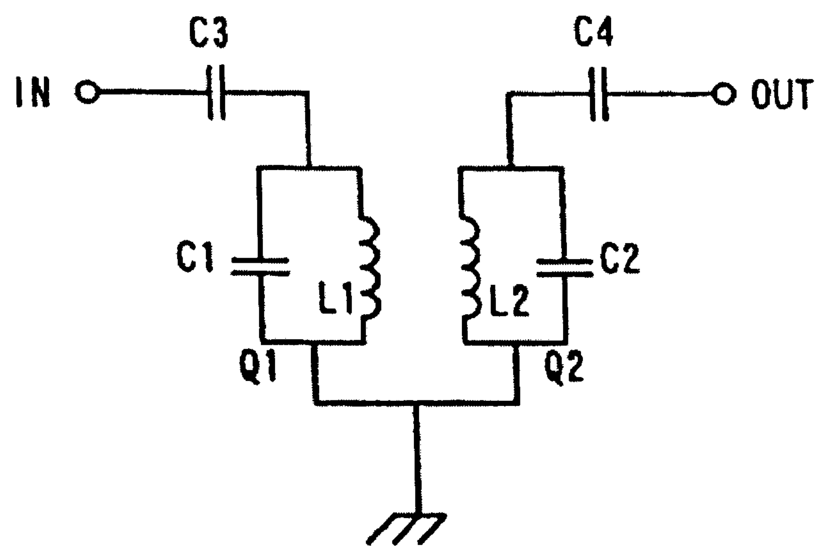
FIG. 16 is an equivalent circuit diagram of the lamination type LC filter of FIG. 14.

FIG. 12 is an exploded perspective view showing another preferred embodiment of a lamination type LC filter according to the present invention, and FIG. 13 is a perspective diagram when the lamination type LC filter of FIG. 12 is seen in the direction of an arrow A in FIG. 2 (from the top).

The fifth preferred embodiment is different from the first preferred embodiment in that the inductor electrodes 51 and 52 disposed on one dielectric sheet 5 are replaced with inductor electrodes 53, 55, 57, 54, 56, and 58. The other features and characteristics are preferably the same as in the first preferred embodiment and thus, the explanation thereof is omitted.

As shown in FIG. 12, regarding the inductor electrodes 53, 55, and 57, substantially U-shaped spiral coils constituting about 2.5 turns as a whole are arranged such that the second end portion 53*c* of the inductor electrode 53 and the first end portion 55*a* of the inductor electrode 55 are connected through a via hole and that the second end portion 55*c* of the inductor electrode 55 and the first end portion 57*a* of the inductor electrode 57 are connected through a via hole.

The first end portion 53*a* of the inductor electrode 53 as a start point of a spiral coil is located in the vicinity of the central portion of the rear of the dielectric sheet 5*a,* and the second end portion 57*c* of the inductor electrode 57 as an end point is located in the vicinity of the central portion of the front of the dielectric sheet 5*c*. Furthermore, the portion extending from the first end portion 53*a* of the inductor electrode 53 to the second end portion 57*c* of the inductor electrode 57, which constitutes a middle portion, extends around through the left rear portion, the left side portion, the left front portion, the left portion in the vicinity of the central portion of the dielectric sheets 5*a* to 5*c* in order. Therefore, the center of the spiral coil is located near the left portion of the dielectric sheets 5*a* to 5*c*.

In the same way, regarding the inductor electrodes 54, 56, and 58, substantially U-shaped spiral coils constituting about 2.5 turns as a whole are arranged such that the second end portion 54*c* of the inductor electrode 54 and the first end portion 56*a* of the inductor electrode 56 are connected through a via hole and such that the second end portion 56*c* of the inductor electrode 56 and the first end portion 58*a* of the inductor electrode 58 are connected through a via hole.

The first end portion 54*a* of the inductor electrode 54 as a start point of a spiral coil is located in the vicinity of the central portion at the rear of the dielectric sheet 5*a,* and the second end portion 58*c* of the inductor electrode 58 as an end point is located in the vicinity of the central portion at the front of the dielectric sheet 5*c*. Furthermore, the portion extending from the first end portion 54*a* of the inductor electrode 54 to the second end portion 58*c* of the inductor electrode 58, which constitutes a middle portion, extends around through the right rear portion, the right side portion, the right front portion, the right portion in the vicinity of the central portion of the dielectric sheets 5*a* to 5*c* in order. Therefore, the center of the spiral coil is located near the right portion of the dielectric sheets 5*a* to 5*c*.

Here, the perspective diagram when the lamination type LC filter 10 is seen in the direction of an arrow in FIG. 2 (from the top) is shown in FIG. 13.

The resonance capacitor electrode 31, the internal ground electrode 21, and the internal ground electrode 61 are disposed above and below the first end portion 53*a* of the inductor electrode 53 such that each of them is substantially perpendicular to the first end portion 53*a* and such that they are stacked on top of another to be substantially parallel to each other.

Furthermore, the second end portion 41*b* of the input capacitor electrode 41, the resonance capacitor electrode 31, the internal ground electrode 21, and the internal ground electrode 61 are disposed above and below the second end portion 57*c* of the inductor electrode 57 such that each of them is substantially perpendicular to the second end portion 57*c* and such that they are stacked on top of another to be substantially parallel to each other.

On the other hand, only the first end portion 41*a* of the input capacitor electrode 41 is above and is substantially perpendicular to the middle portion 53*b* and the second end portion 53*c* of the inductor electrode 53, the first end portion 55*a,* the middle portion 55*b,* and the second end portion 55*c* of the inductor electrode 55, and the first end portion 57*a* and the middle portion 57*b* of the inductor electrode 57, which constitute a middle portion of the spiral coil, and the other internal electrodes constituting a capacitance are not disposed below the middle portion. Furthermore, the other internal electrodes constituting a capacitance are also not disposed under the middle portion.

Therefore, in the perspective diagram of FIG. 13, the inductor electrodes 53, 55, and 57 do not overlap one half or more in area with the other internal electrodes.

In the same way, the resonance capacitor electrode 32, the internal ground electrode 22, and the internal ground electrode 62 are disposed above and below the first end portion 54*a* of the inductor electrode 54 such that each of them is substantially perpendicular to the first end portion 54*a* and such that they are stacked one on top of another to be substantially parallel to each other.

Furthermore, the second end portion 42*b* of the output capacitor electrode 42, the resonance capacitor electrode 32, the internal ground electrode 22, and the internal ground electrode 62 are disposed above and below the second end portion 58*c* of the inductor electrode 58 such that each of them is substantially perpendicular to the first end portion 54*a* and such that they are stacked one on top of another to be substantially parallel to each other.

On the other hand, only the first end portion 42*a* of the output capacitor electrode 41 is above and is substantially perpendicular to the middle portion 54*b* and the second end portion 54*c* of the inductor electrode 54, the first end portion 56*a,* the middle portion 56*b,* and the second end portion 56*c* of the inductor electrode 56, and the first end portion 58*a* and the middle portion 58*b* of the inductor electrode 58, which constitute a middle portion of the spiral coil, and the other internal electrodes constituting a capacitance are not disposed below the middle portion. Furthermore, the other internal electrodes constituting a capacitance are also not disposed below the middle portion.

Therefore, in the perspective diagram of FIG. 13, the inductor electrodes 54, 56, and 58 do not overlap one half or more in area with the other internal electrodes.

Because of the unique construction described above, in the inductor electrodes 53, 55, 57, 54, 56, and 58, although a first end portion and a second end portion overlap with the other internal electrodes constituting a capacitance, since the middle portion does not overlap with the other internal electrodes, a magnetic field generated by the inductor electrodes is further minimized by the other internal electrodes.

In the present preferred embodiments described herein, although the inductor electrodes are described as preferably having a bent shape or curved shape, that is, substantially U-shaped, they are not limited to these shapes, and, for example, the inductor electrodes may be formed to have a bent shape that is substantially V-shaped, or to have various polygonal shapes, or a curved shape, that is, a substantially circular shape, or any other suitable shapes.

As described above, according to various preferred embodiments of the present invention, when the inductor electrodes are constructed so as not to overlap with the other internal electrodes constituting a capacitance as much as possible, a magnetic field generated by the inductor electrodes is minimized by the other internal electrodes.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A lamination type LC filter comprising:

a laminated body comprising a plurality of dielectric sheets;

a first parallel LC resonance circuit located at an input side and including an inductor and a capacitor connected in parallel, the inductor of said first parallel LC resonance circuit being defined by a first inductor electrode, and the capacitor of said first parallel LC resonance circuit being defined by a first capacitor electrode and a first internal ground electrode;

a second parallel LC resonance circuit located at an output side and including an inductor and a capacitor connected in parallel, the inductor of said second parallel LC resonance circuit being defined by a second inductor electrode and the capacitor of said second parallel LC resonance circuit being defined by a second capacitor electrode and a second internal ground electrode;

wherein the first parallel LC resonance circuit and the second parallel LC resonance circuit are electromagnetically coupled;

each of the first and second inductor electrodes, the first and second capacitor electrodes and the first and second internal ground electrodes are provided inside the laminated body;

a first end portion of the first inductor electrode is connected to the first capacitor electrode and a second end portion of the first inductor electrode is connected to the first internal ground electrode;

a first end portion of the second inductor electrode is connected to the second capacitor electrode and a second end portion of the second inductor electrode is connected to the second internal ground electrode;

the first capacitor electrode and the first internal ground electrode are strip-shaped, and the first capacitor electrode and the first internal ground electrode overlap each other in a perspective view in which the lamination type LC filter is seen from the top;

the second capacitor electrode and the second internal ground electrode are strip-shaped, and the second capacitor electrode and the second internal ground electrode overlap each other in a perspective view in which the lamination type LC filter is seen from the top;

a portion of the first inductor electrode does not overlap with the first capacitor electrode and does not overlap with the first internal ground electrode in the perspective view in which the lamination type LC filter is seen from the top; and a portion of the second inductor electrode does not overlap with the second capacitor electrode and does not overlap with the second internal ground electrode in the perspective view in which the lamination type LC filter is seen from the top.

2. A lamination type LC filter according to claim 1, wherein the first and second inductor electrodes have one of a bent shape and a curved shape.

3. A lamination type LC filter according to claim 1, wherein first and second external ground electrodes to be connected to the first and second internal ground electrodes, respectively, are provided on side surfaces of the laminated body and the first and second external ground electrodes have substantially the same width as that of the first and second internal ground electrodes.

4. A lamination type LC filter according to claim 3, wherein at least one of the first and second internal ground electrodes is exposed at a front portion of the dielectric sheets, and a second end portion is exposed at a rear portion of the dielectric sheets.

5. A lamination type LC filter according to claim 1, wherein the first and second inductor electrodes have a substantially U-shaped bending coil pattern.

6. A lamination type LC filter according to claim 1, further comprising:

an input adjustment capacitor being provided between an external input electrode and the first parallel LC resonance circuit; and an output adjustment capacitor being provided between an external output electrode and the second parallel LC resonance circuit.

7. A lamination type LC filter according to claim 6, wherein the input adjustment capacitor is defined by an input capacitor electrode and the first capacitor electrode, and the output adjustment capacitor is defined by an output capacitor electrode and the second capacitor electrode.

8. A lamination type LC filter according to claim 7, wherein the portion of the first inductor electrode does not overlap with the first capacitor electrode, the first internal ground electrode and the input capacitor electrode in the perspective view in which the lamination type LC filter is seen from the top, and the portion of the second inductor electrode does not overlap with the second capacitor electrode, the second internal ground electrode and the output capacitor electrode in the perspective view in which the lamination type LC filter is seen from the top.

9. A lamination type LC filter according to claim 1, further comprising:

a third internal ground electrode adjacent to a bottom surface of the laminated body and which overlaps with at least one of the first capacitor electrode and the first internal ground electrode in the perspective view in which the lamination type LC filter is seen from the top; and a fourth internal ground electrode adjacent to the bottom surface of the laminated body and which overlaps with at least one of the second capacitor electrode and second internal ground electrode in the perspective view in which the lamination type LC filter is seen from the top.

10. A lamination type LC filter according to claim 9, wherein the third internal ground electrode does not overlap with the portion of the first inductor electrode which does not overlap with the first capacitor electrode and does not overlap with the first internal ground electrode in the perspective view in which the lamination type LC filter is seen from the top, and the fourth internal ground electrode does not overlap with the portion of the second inductor electrode which does not overlap with the second capacitor electrode and does not overlap with the second internal ground electrode in the perspective view in which the lamination type LC filter is seen from the top.

11. A lamination type LC filter according to claim 1, wherein the portion of the first inductor electrode, which does not overlap with the first capacitor electrode and does not overlap with the first internal ground electrode in the perspective view in which the lamination type LC filter is seen from the top, excludes the first and second end portions of the first inductor, and the portion of the second inductor electrode, which does not overlap with the second capacitor electrode and does not overlap with the second internal ground electrode in the perspective view in which the lamination type LC filter is seen from the top, excludes the first and second end portions of the second inductor.

12. A lamination type LC filter according to claim 1, wherein the first and second inductor electrodes are provided on a common one of the plurality of dielectric sheets, the first and second capacitor electrodes are provided on a common one of the plurality of dielectric sheets, and the first and second internal ground electrodes are provided on a common one of the plurality of dielectric sheets.

* * * * *